(12) United States Patent
Van Rijs et al.

(10) Patent No.: US 7,989,879 B2
(45) Date of Patent: Aug. 2, 2011

(54) LDMOS TRANSISTOR

(75) Inventors: Freerk Van Rijs, Nijmegen (NL);
Stephan J. C. H. Theeuwen, Nijmegen (NL); Petra C. A. Hammes, Ede (NL)

(73) Assignee: NXP B.V., Eindhoven (NL)

( * ) Notice: Subject to any disclaimer, the term of this patent is extended or adjusted under 35 U.S.C. 154(b) by 313 days.

(21) Appl. No.: 11/995,087

(22) PCT Filed: Jul. 10, 2006

(86) PCT No.: PCT/IB2006/052325
§ 371 (c)(1),
(2), (4) Date: Oct. 24, 2008

(87) PCT Pub. No.: WO2007/007273
PCT Pub. Date: Jan. 18, 2007

(65) Prior Publication Data
US 2009/0218622 A1    Sep. 3, 2009

(30) Foreign Application Priority Data

Jul. 13, 2005   (EP) .................................. 05106422

(51) Int. Cl.
*H01L 29/78* (2006.01)
(52) U.S. Cl. . 257/328; 257/343; 257/288; 257/E29.256; 257/E29.261
(58) Field of Classification Search .................. 257/500, 257/343, E21.417, E29.256
See application file for complete search history.

(56) References Cited

U.S. PATENT DOCUMENTS

| 5,801,416 | A | 9/1998 | Choi et al. | |
|---|---|---|---|---|
| 6,545,316 | B1 | 4/2003 | Baliga | |
| 2005/0118753 | A1 | 6/2005 | Efland et al. | |
| 2005/0151207 | A1 * | 7/2005 | Moscatelli et al. | 257/395 |

FOREIGN PATENT DOCUMENTS

| CN | 1447987 A | 10/2003 |
|---|---|---|
| EP | 1321985 A1 | 6/2003 |
| WO | 0014791 A1 | 3/2000 |
| WO | 2005022645 A2 | 3/2005 |

* cited by examiner

*Primary Examiner* — N. Drew Richards
*Assistant Examiner* — Mamadou Diallo

(57) ABSTRACT

The LDMOS transistor (1) of the invention comprises a source region (3), a channel region (4), a drain extension region (7) and a gate electrode (10). The LDMOS transistor (1) further comprises a first gate oxide layer (8) and a second gate oxide layer (9), which is thicker than the first gate oxide layer (8). The first gate oxide layer (8) at least extends over a first portion of the channel region (4), which is adjacent to the source region (3). The second gate oxide layer (9) extends over a region where a local maximum (A, B) of the electric field (E) generates hot carriers thereby reducing the impact of the hot carriers and reducing the Idq-degradation. In another embodiment the second gate oxide layer (9) extends over a second portion of the channel region (4), which mutually connects the drain extension region (7) and the first portion of the channel region (4), thereby improving the linear efficiency of the LDMOS transistor (1).

10 Claims, 4 Drawing Sheets

LDMOS TRANSISTOR

In base stations for personal communications systems (GSM, EDGE, W-CDMA), the RF power amplifiers are the key components. For these power amplifiers, RF Laterally Diffused Metal Oxide Semiconductor, generally abbreviated as LDMOS, transistors are now the preferred choice of technology, because of their excellent high power capabilities, gain and linearity. To be able to meet the demands imposed by new communication standards, the performance of the LDMOS transistors with continuously shrinking dimensions is subject to continuous improvements.

In WO 2005/022645 an LDMOS transistor is disclosed, which is provided on a semiconductor substrate and comprises a source and a drain region, that are mutually connected through a channel region, and a gate electrode for influencing an electron distribution in the channel region. The drain region comprises a drain contact region and a drain extension region extending in the semiconductor substrate from the drain contact region towards the channel region. A shield layer with a stepped structure is provided between the gate electrode and the drain contact region on a portion of the drain extension region to shield a portion of the gate electrode and the drain region. Hot carrier degradation of the LDMOS transistor manifests itself by a drift in the quiescent current ($I_{dq}$) of the LDMOS transistor, and is also referred to as $I_{dq}$-degradation. When the gate length of the LDMOS transistor is reduced, for example to advantageously reduce the area of the LDMOS transistor, it has been found that this LDMOS transistor exhibits a too high $I_{dq}$-degradation. An accelerated $I_{dq}$-degradation reduces the lifetime of the LDMOS transistor.

It is an object of the invention to provide an LDMOS transistor with a reduced $I_{dq}$-degradation. According to the invention, this object is achieved by providing an LDMOS transistor as claimed in claim 1.

The LDMOS transistor according to the invention is provided in a semiconductor substrate and comprises a source region and a drain region that are mutually connected through a channel region. A gate electrode extends over the channel region and is able to influence an electron distribution in the channel region. The drain region comprises a drain contact region and a drain extension region, which is adjacent to the channel region. The LDMOS transistor according to the invention further comprises a first insulation layer which is provided on at least a first portion of the channel region and a second insulation layer which is provided adjacent to the first insulation layer. The second insulation layer is thicker than the first insulation layer thereby providing an improved protection against hot carriers and hence reducing the $I_{dq}$-degradation of the LDMOS transistor.

In a first embodiment of the LDMOS transistor according to the invention, the first insulation layer extends over the channel region and over a first portion of the drain extension region. The second insulation layer extends over a first portion of the drain extension region where the electric field, which creates the hot carriers, has a local maximum. This embodiment reduces the $I_{dq}$-degradation caused by this local maximum of the electric field.

In a second embodiment of the LDMOS transistor according to the invention, the second insulation layer extends over a second portion of the channel region, which second portion mutually connects the drain extension region and the first portion of the channel region over which the first insulation layer extends. In this way an improved protection is provided against hot carriers that are generated in a region where the drain extension region and the channel region adjoin. An additional advantage of this embodiment is an improved linear efficiency of the LDMOS transistor, which is defined as the power efficiency, which is the output power divided by the DC power, at a specific value of the third order intermodulation distortion.

In a third embodiment of the LDMOS transistor according to the invention, the second insulation layer extends over a portion of the drain extension region and over a second portion of the channel region, which second portion mutually connects the drain extension region and the first portion of the channel region over which the first insulation layer extends. In this way the $I_{dq}$-degradation is reduced further because an improved protection is provided against both generation sources of hot carriers simultaneously. An additional advantage of this embodiment is the improved linear efficiency of the LDMOS transistor.

In a fourth embodiment the LDMOS transistor comprises a shield layer between the gate electrode and the drain contact region, wherein the shield layer extends over a part of the drain extension region. Due to the close proximity of the shield layer to the gate electrode and to the drain extension region, the electric field distribution in the drain extension region is influenced such by the shield layer that the $I_{dq}$.

$I_{dq}$-degradation is reduced even further. Furthermore, the introduction of the shield layer also reduces the parasitic feedback capacitance between the gate electrode and the drain region, which is beneficial for the RF performance of the LDMOS transistor.

In a fifth embodiment the drain extension region of the LDMOS transistor comprises a first and a second subregion, which have different dopant concentrations, thereby influencing the electric field distribution in the drain extension region such that the $I_{dq}$-degradation is reduced further. The $I_{dq}$-degradation is improved further when the shield layer also extends over the region where the first and the second subregion adjoin.

In a sixth embodiment the LDMOS transistor comprises a shield layer with a stepped structure, which combines the advantages of a reduced $I_{dq}$-degradation with an improved current capability and on-resistance of the LDMOS transistor.

A method of manufacturing the LDMOS transistor according to the invention comprises the steps of providing a seed insulation layer on a semiconductor substrate, followed by removing selected portions of the seed insulation layer, thereby exposing portions of the semiconductor substrate. Thereafter a first insulation layer is formed on the exposed portions of the semiconductor substrate and the non-removed portions of the seed insulation layer are transformed into a second insulation layer, which adjoins the first insulation layer, in which the second insulation layer is thicker than the first insulation layer. Thereafter a gate electrode is formed on a portion of the first insulation layer, and a source and a drain region are formed, wherein the drain region comprises a drain extension region.

These and other aspects of the invention will be further elucidated and described with reference to the drawings, in which.

The figures are not drawn to scale. In general, identical components are denoted by the same reference numerals in the figures.

Figure 1:
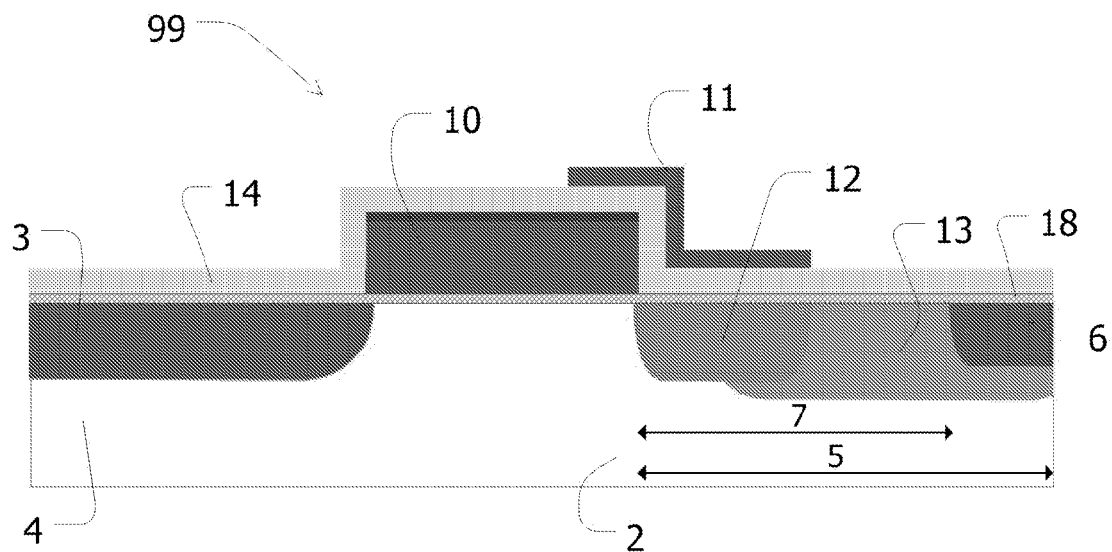
FIG. 1 shows a diagrammatical cross-sectional view of an LDMOS transistor according to the prior art.

FIG. 1 depicts a cross-sectional view of a conventional LDMOS transistor 99 according to the prior art. The LDMOS transistor 99 comprises a substrate 2 of a semiconductor material, in this case, p-type silicon. The LDMOS transistor 99 further comprises a silicided polysilicon gate electrode 10, which extends over a p-type channel region 4, and an n-type source region 3 and an n-type drain region 5, the latter two being mutually connected through the p-type channel region 4. The channel region 4, the source region 3 and the drain region 5 are fabricated in the substrate 2. The channel region 4 is, in this example, a laterally diffused p-type region. The gate electrode 10 is separated from the substrate 2 by a gate oxide layer 18, which for example comprises thermally grown silicon dioxide.

The drain region 5 comprises an n-type drain extension region 7, which accommodates the high voltage operation of the LDMOS transistor 99, and further comprises an n-type drain contact region 6, which is used to contact the drain region 5 to an interconnect structure (not shown). The drain extension region 7 has a lower doping level than the drain contact region 6 and is optimized for a maximum output power of the LDMOS transistor 99.

The drain extension region 7 comprises a first drain extension subregion 12 and a second drain extension subregion 13, which subregions are relatively lowly doped n-type regions. This reduces the $I_{dq}$-degradation at the cost of some RF-performance with respect to the situation where the drain extension region 7 comprises only one doping level.

The LDMOS transistor 99 according to the prior art further comprises a shield layer 11, which serves as a dummy gate electrode and gives a better trade-off between $I_{dq}$-degradation and RF performance. The shield layer 11 in this case extends over a portion of the gate electrode 10 and the first drain extension subregion 12, and may also extend over a portion of the second drain extension subregion 13. The shield layer 11 is separated from the gate electrode 10 by an insulation layer 14, which for example comprises a plasma oxide. The shield layer 11 is separated from the substrate 2, and hence the drain extension region 7, by the gate oxide layer 18 and the insulation layer 14. Due to the close proximity of the shield layer 11 to the gate electrode 10 and the drain extension region 7, the electric field distribution in the drain extension region 7 is improved, thereby reducing both the $I_{dq}$-degradation and the feedback capacitance, the latter being beneficial for the RF performance.

Figure 2:
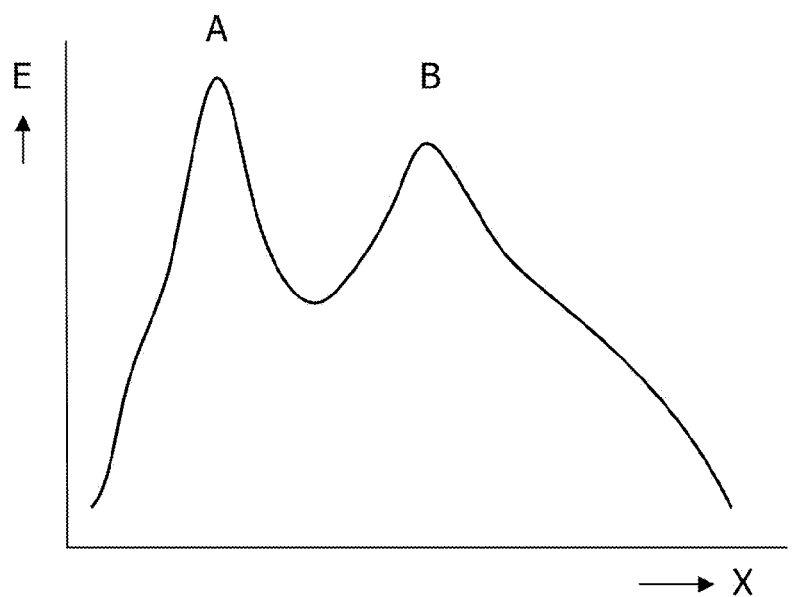
FIG. 2 shows the electric field distribution along the surface of the substrate in the drain extension region at the maximum supply voltage and at a constant gate voltage.

The electric field distribution in the drain extension region 7 of the LDMOS transistor 99 according to the prior art is depicted in FIG. 2, which shows the electric field E at the surface of the substrate 2 in the channel region 4 and in the drain extension region 7 as a function of the distance X from the source region 3 measured at a constant gate voltage and a maximum supply voltage, which are the conditions for a hot carrier stress test. The electric field E distribution exhibits a first peak A and a second peak B. The first peak A of the electric field E is located near the position where the channel region 4 and the drain extension region 7 adjoin. The second peak B of the electric field E is located in a part of the first drain extension subregion 12, which is covered by the shield layer 11. Simulations show that the first peak A of the electric field E dominates the behavior of the $I_{dq}$-degradation due to the higher current densities in this region than in the first drain extension subregion 12. However, the stack of insulation layers, comprising the gate oxide layer 18 and the insulation layer 14, which extend over the location of the second peak B of the electric field E, are more sensitive to $I_{dq}$-degradation than the gate oxide layer 18 which extends over the location of the first peak A of the electric field E. Particularly the surface where the gate oxide layer 18 and the insulation layer 14 adjoin is a trapping center for hot carriers that are generated by the second peak B of the electric field E, resulting in an increased $I_{dq}$-degradation. Hence, in reality the second peak B of the electric field E dominates the behavior of the $I_{dq}$-degradation, which is in contrast with the results found by the simulations.

Figure 3:
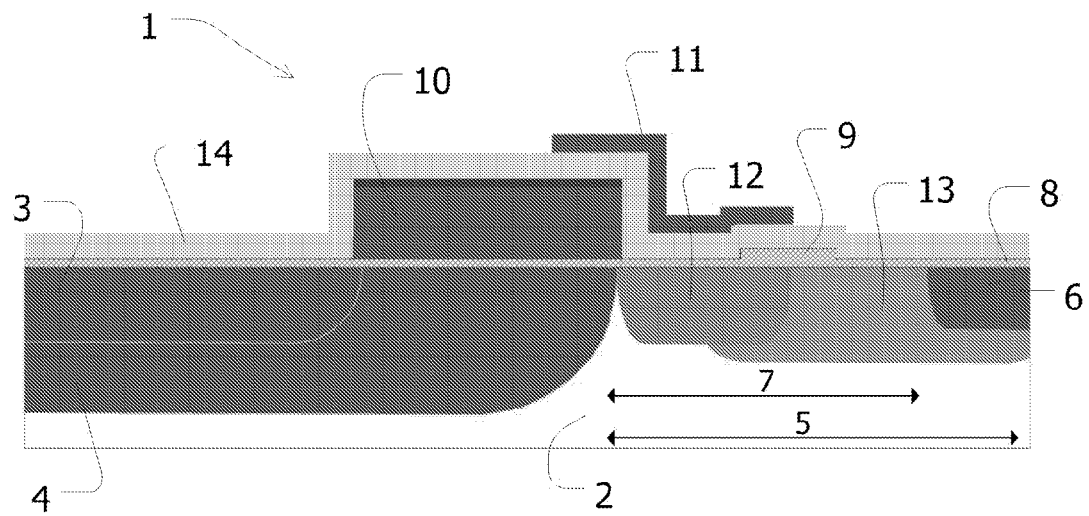
FIG. 3 shows a diagrammatical cross-sectional view of an LDMOS transistor according to an embodiment of the invention.

FIG. 3 depicts a cross-sectional view of a first embodiment of an LDMOS transistor 1 according to the invention. The LDMOS transistor 1, similar to the LDMOS transistor 99 of the prior art, comprises the substrate 2, the gate electrode 10, the shield layer 11, the insulation region 14, the channel region 4, the source region 3, the drain region 5, which comprises the drain contact region 6 and the drain extension region 7, which comprises a first drain extension subregion 12 and a second drain extension subregion 13. It should be noted that the drain extension region 7 may also comprise only one doping level or multiple different-type doping levels. The main difference with the LDMOS transistor 99 of the prior art is that the LDMOS transistor 1 according the invention comprises a first gate oxide layer 8, which extends over the channel region 4 and over a first and second portion of the drain extension region 7, and a second gate oxide layer 9, which extends over a third portion of the drain extension region 7, which third portion mutually connects the first and the second portions of the drain extension region 7 and extends over the location of the second peak B of the electric field. The first gate oxide layer 8 and the second gate oxide layer 9 comprise for example a thermally grown silicon dioxide. The second gate oxide layer 9 is thicker than the first gate oxide layer 8 thereby increasing the distance that the hot carriers travel before they reach the surface where the first gate oxide layer 8 and the insulation layer 14 adjoin. This results in a reduction of the energy of the hot carriers at that surface and hence in a reduction of the $I_{dq}$-degradation. The thickness of the second gate oxide layer 9 is for example 60 nm and the thickness of the first gate oxide layer 8 for example 30 nm.

The improvement of the $I_{dq}$-degradation has been proven by a stress test applied to the LDMOS transistor 1. The stress test comprises applying a constant gate voltage in combination with a maximum supply voltage, for example 28V, during a time period. The constant gate voltage is such that the value of the $I_{dq}$-current is comparable to the $I_{dq}$-current in an application at the start of the stress test. The value of the $I_{dq}$-current at the beginning of the stress test is compared to the value of the $I_{dq}$-current at the end of the stress test, the latter value being normally smaller than the first value. The result of the stress test (after extrapolation) was that the $I_{dq}$-degradation of the LDMOS transistor 1 was reduced to a value below the requirement, which is a degradation of 5% of the $I_{dq}$-current after 20 years.

Figure 4:
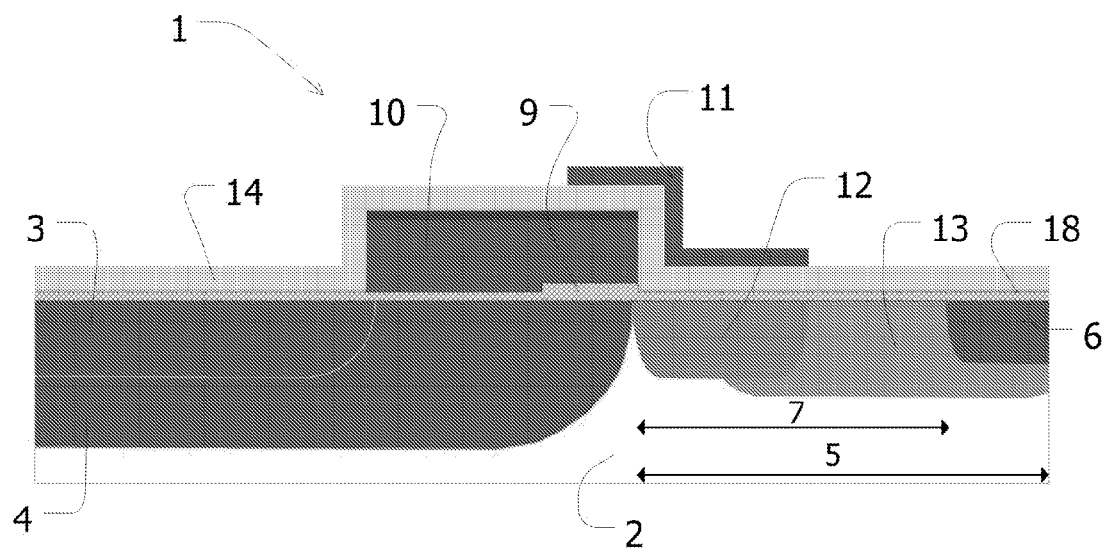
FIG. 4 shows a diagrammatical cross-sectional view of an LDMOS transistor according to a second embodiment of the invention.

FIG. 4 depicts a cross-sectional view of a second embodiment of the LDMOS transistor 1 according to the invention. In this embodiment the first gate oxide layer 8 extends over a first portion of the channel region 4 and over the drain extension region 7, and the second gate oxide layer 9 extends over a second portion of the channel region 4, which second portion is adjacent to the drain extension region 7 and adjacent the first portion of the channel region 4 and has for example a width of 200 nm. Also in this embodiment the second gate oxide layer 9 is thicker than the first gate oxide layer 8 thereby providing an improved protection against hot carriers generated near the location of the first peak A of the electric field E. This improved protection results in a reduced $I_{dq}$-degradation of the LDMOS transistor 1. Another advantage of this embodiment is an improvement of the linear efficiency of the LDMOS transistor 1.

Also this improvement of the $I_{dq}$-degradation has been proven by a stress test applied to the LDMOS transistor 1 according to this embodiment. In this example the width of the gate electrode was 400 nm, the width of the first gate oxide layer 8 extending over the first portion of the channel region 4 150 nm and the width of the second gate oxide layer 9 extending over the first portion of the channel region 4 250 nm. The result of this stress test was that the degradation of the $I_{dq}$-current of the LDMOS transistor 1 after 20 years was reduced by a value of 10% compared to the degradation of the $I_{dq}$-current of the LDMOS transistor 99 (after extrapolation). The linear efficiency of the LDMOS transistor 1 was 4% higher than the linear efficiency of the LDMOS transistor 99.

Figure 5:
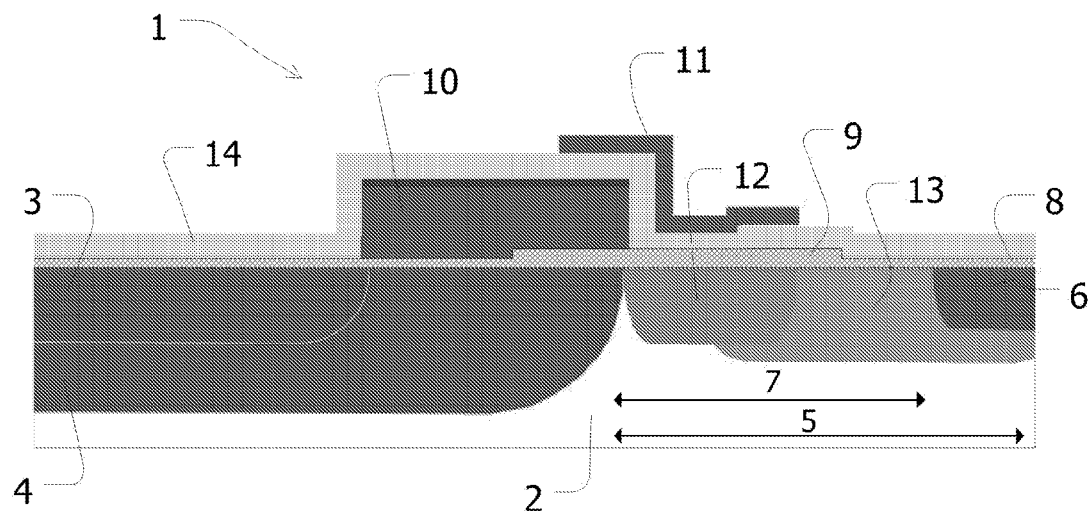
FIG. 5 shows a diagrammatical cross-sectional view of an LDMOS transistor according to a third embodiment of the invention.

FIG. 5 depicts a cross-sectional view of a third embodiment of the LDMOS transistor 1 according to the invention. In this embodiment the first gate oxide layer 8 extends over a first portion of the channel region 4 and the second gate oxide layer 9 extends over a portion of the drain extension region 7 and over a second portion of the channel region 4, which second portion mutually connects the drain extension region 7 and the first portion of the channel region 4. Also in this embodiment the second gate oxide layer 9 is thicker than the first gate oxide layer 8. In this way a combined improved protection is provided against hot carriers generated both near the location of the first peak A of the electric field E and near the location of the second peak B of the electric field E. This improved protection results in a further reduced $I_{dq}$-degradation of the LDMOS transistor 1. Another advantage of this embodiment is the improvement of the linear efficiency of the LDMOS transistor 1.

Figure 6:
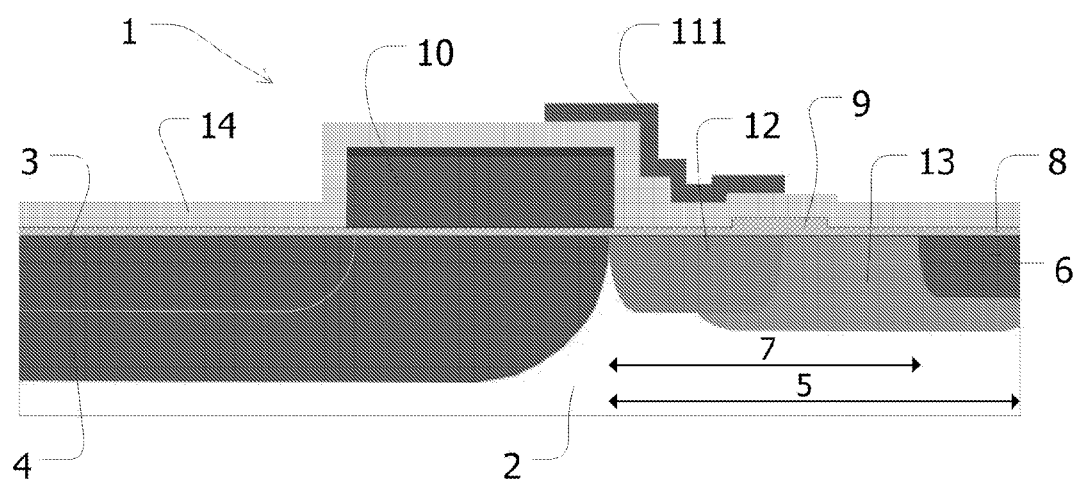
FIG. 6 shows a diagrammatical cross-sectional view of an LDMOS transistor according to a fourth embodiment of the invention.

By introducing a stepped shield layer structure 111, as is shown in FIG. 6, also the current capability and the on-resistance of the LDMOS transistor 1 are improved.

Figure 7A:
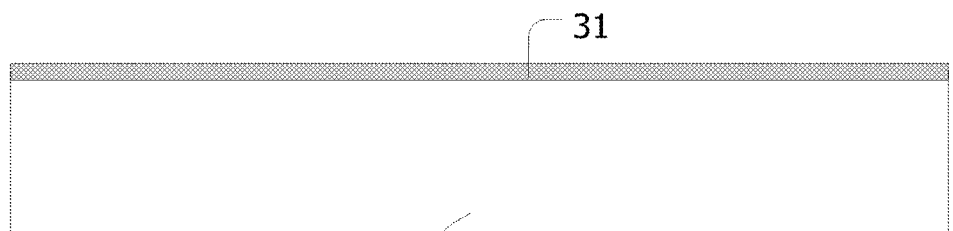
FIGS. 7a-e shows diagrammatical cross-sectional views depicting a method of fabricating an LDMOS transistor according to an embodiment of the invention.
Figure 7B:
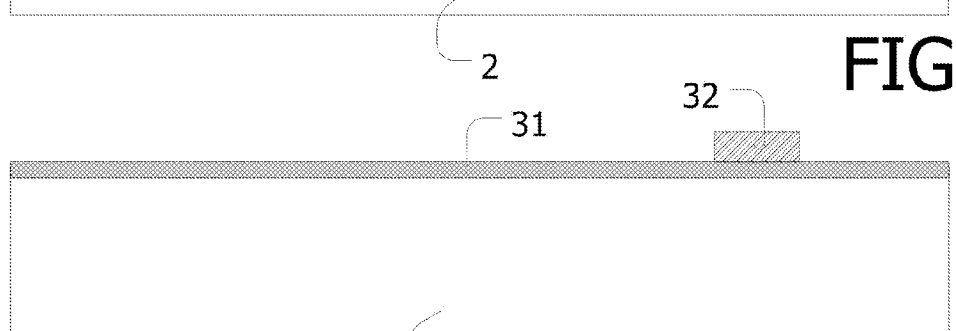
Figure 7C:
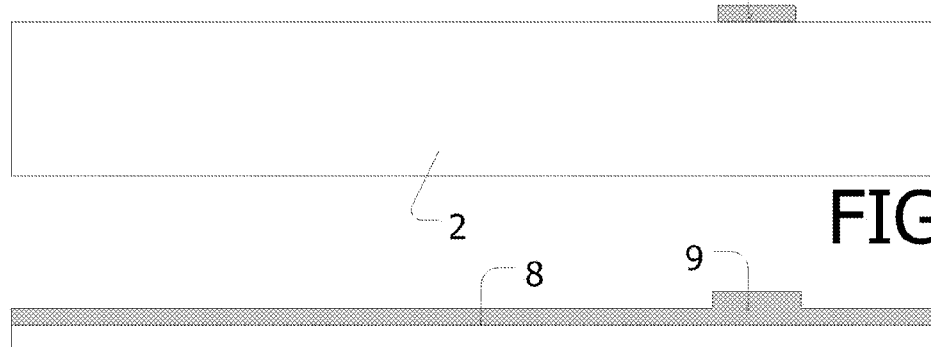
Figure 7D:
Figure 7E:
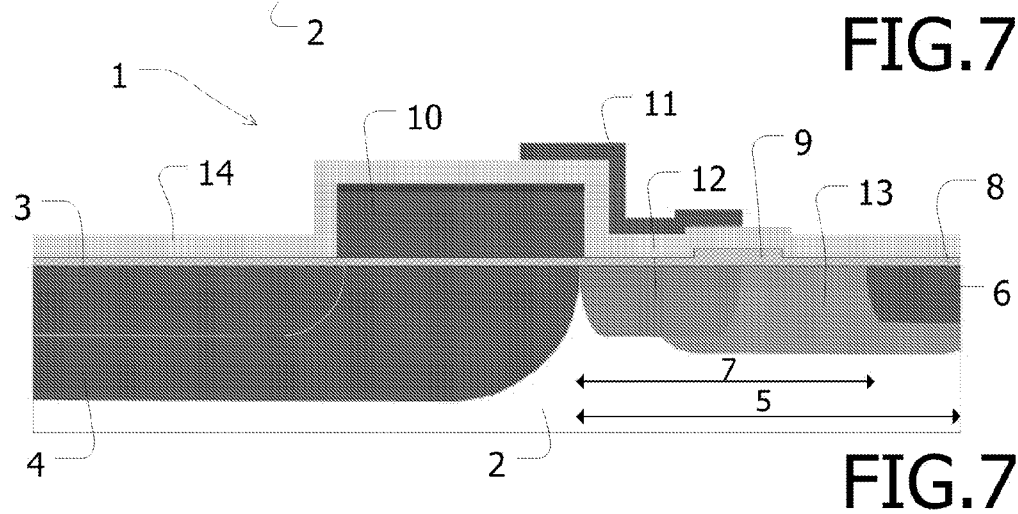

FIGS. 7a-e depict a method for fabricating the LDMOS transistor 1 according the invention. On the substrate 2 a seed insulation layer 31 is formed using conventional techniques, such as thermal oxidation, as is shown in FIG. 7a. Then, using photolithography, a mask 32 is formed which defines the regions where the second gate oxide layer 9 will be formed, as is shown in FIG. 7b. Thereafter the portions of the seed insulation layer 31, which are not covered by the mask 32, are removed using commonly known etching techniques, thereby creating gate oxide regions 33 as is shown in FIG. 7c. Then the mask 32 is removed, and for example a thermal oxidation forms the first gate oxide layer 8 and the second gate oxide layer 9, as is shown in FIG. 7d. Thereafter the processing continues with commonly known fabrication steps, which results in the formation of the LDMOS transistor 1 as is shown in FIG. 7e.

In summary, the LDMOS transistor of the invention comprises a source region, a channel region, a drain extension region and a gate electrode. The LDMOS transistor further comprises a first gate oxide layer and a second gate oxide layer, which is thicker than the first gate oxide layer. The first gate oxide layer at least extends over a first portion of the channel region, which is adjacent to the source region. The second gate oxide layer extends over a region where a local maximum A, B of the electric field E generates hot carriers thereby reducing the impact of the hot carriers and reducing the $I_{dq}$-degradation. In another embodiment the second gate oxide layer extends over a second portion of the channel region, which mutually connects the drain extension region and the first portion of the channel region, thereby improving the linear efficiency of the LDMOS transistor.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. An LDMOS transistor provided in a semiconductor substrate, the LDMOS transistor comprising a gate electrode, which extends over a channel region, a source region and a drain region being mutually connected through the channel region, the drain region comprising a drain contact region and a drain extension region extending from the drain contact region towards the channel region, the LDMOS transistor further comprising a first insulation layer, which at least extends over a first portion of the channel region adjacent to the source region, wherein a second insulation layer is provided laterally adjacent to the first insulation layer, the second insulation layer having a greater thickness than the first insulation layer, wherein at least a portion of the second insulation layer is at the same level as the first insulation layer, wherein the second insulation layer extends only over at least a portion of the drain extension region, wherein the gate electrode does not extend over the second insulation layer.

2. An LDMOS transistor as claimed in claim 1 further comprising a shield layer between the gate electrode and the drain contact region, the shield layer covering a part of the drain extension region.

3. An LDMOS transistor as claimed in claim 1, wherein the drain extension region comprises a first and a second drain extension subregion, in which the first drain extension subregion has a higher dopant concentration than the second drain extension subregion and adjoins the channel region and the second drain extension subregion, which adjoins the drain contact region.

4. An LDMOS transistor as claimed in claim 1 wherein the shield layer and the second insulation layer both extend over the region where the first and the second drain extension subregion adjoin.

5. An LDMOS transistor as claimed in claim 2 wherein the shield layer has at least two stepped structure regions.

6. An LDMOS transistor as claimed in claim 2 wherein the shield layer comprises a metal silicide.

7. A method of manufacturing an LDMOS transistor, the method comprising:
providing a seed insulation layer on a semiconductor substrate;
removing selected portions of the seed insulation layer, thereby exposing portions of the semiconductor substrate;

forming a first insulation layer on the exposed portions of the semiconductor substrate and transforming the non-removed portions of the seed insulation layer into a second insulation layer adjoining the first insulation layer, in which the second insulation layer is thicker than the first insulation layer;

forming a gate electrode only on a portion of the first insulation layer; and forming a source and a drain region, said drain region comprising a drain extension region, said second insulation layer extending only over at least a portion of the drain extension region.

8. An LDMOS transistor as claimed in claim 2 further comprising a third insulation layer disposed on top of the first insulating layer and the second insulating layer, said third insulating layer separating the shield layer from the gate electrode.

9. An LDMOS transistor as claimed in claim 1 wherein the first insulation layer further extends over a first portion of the drain extension region, and wherein the second insulation layer extends over a second portion of the drain extension region, wherein the first portion of the drain extension region adjoins the channel region, and the first portion of the drain extension region further adjoins the second portion of the drain extension region.

10. An LDMOS transistor as claimed in claim 9 wherein the channel region is directly adjacent to the first portion of the drain extension region, and the first portion of the drain extension region is directly adjacent to the second portion of the drain extension region.

* * * * *